(12) United States Patent
Joo et al.

(10) Patent No.: US 11,525,189 B2
(45) Date of Patent: Dec. 13, 2022

(54) METHOD OF MANUFACTURING $MOS_2$ HAVING 1T CRYSTAL STRUCTURE

(71) Applicant: SEOUL NATIONAL UNIVERSITY R&DB FOUNDATION, Seoul (KR)

(72) Inventors: Young Chang Joo, Seoul (KR); Won Hyo Joo, Seoul (KR); Dae Hyun Nam, Gyeongsangnam-do (KR); Ji Yong Kim, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 541 days.

(21) Appl. No.: 16/675,351

(22) Filed: Nov. 6, 2019

(65) Prior Publication Data

US 2020/0291540 A1  Sep. 17, 2020

(30) Foreign Application Priority Data

Mar. 13, 2019 (KR) .................. 10-2019-0028798

(51) Int. Cl.
| | |
|---|---|
| *C30B 1/10* | (2006.01) |
| *C25B 1/02* | (2006.01) |
| *C30B 29/46* | (2006.01) |
| *C25B 11/091* | (2021.01) |

(52) U.S. Cl.
CPC .................. *C30B 1/10* (2013.01); *C25B 1/02* (2013.01); *C25B 11/091* (2021.01); *C30B 29/46* (2013.01)

(58) Field of Classification Search
CPC ......... C30B 1/10; C30B 29/46; C25B 11/091; C25B 1/02
See application file for complete search history.

(56) References Cited

FOREIGN PATENT DOCUMENTS

| CN | 109112565 A | 1/2019 |
|---|---|---|
| KR | 1020170016116 | 2/2017 |
| KR | 20170042157 A | 4/2017 |

OTHER PUBLICATIONS

Wu et al. "Metallic 1T MoS2 nanosheet arrays vertically grown on activated carbon fiber cloth for enhcanced Li ion storage performance" Journal of Materials Cehmisty A vol. 5, pp. 14061-14070 2017.*
Sharma et al. "Stable and scalablemetallic phase on MoS2 using framing gas microwave plasma" Indian school of physics 2017.*
Zhao et al. "Metastable MoS2: Crystal Structure, Electronic Band Structure, Synthetic Approach and Intriguing Physical Properties" Chem. Eur. J. 2018, 24, 15942-15954.
Ambrosi et al. 2H 1T phase transition and hydrogen evolution activity of MoS2, MoSe2, WS2 and WSe2 strongly depends on the MX2 composition Chem. Commun., 2015, 51, 8450.

(Continued)

*Primary Examiner* — Robert M Kunemund
(74) *Attorney, Agent, or Firm* — Mayer & Williams PC; Stuart H. Mayer

(57) ABSTRACT

Provided is a method of manufacturing $MoS_2$ having a 1T crystal structure. The method includes performing phase transition from a 2H crystal structure of $MoS_2$ to the 1T crystal structure by reacting $MoS_2$ having the 2H crystal structure with CO gas. The phase transition includes annealing the $MoS_2$ having the 2H crystal structure in an atmosphere including CO gas.

14 Claims, 15 Drawing Sheets

(56) References Cited

OTHER PUBLICATIONS

Kang, et al. "Plasmonic Hot Electron Induced Structural Phase Transition in a MoS2 Monolayer" Adv. Mater. 2014, 26, 3467-6471.
Ku et al. "High phase-purity 1T'-MoS2- and 1T' - MoSe2—layered crystals" Nature Chemistry, vol. 10, Jun. 2018 638-643.
Jingfang Zhang Cuibo Liu "Insights into Single-Atom Metal—Support Interactions in Electrocatalytic Water Splitting" Feb. 8, 2019, Small Methods Small Methods, vol. 3, Issue 9, 1800481.

* cited by examiner

[FIG. 1A]
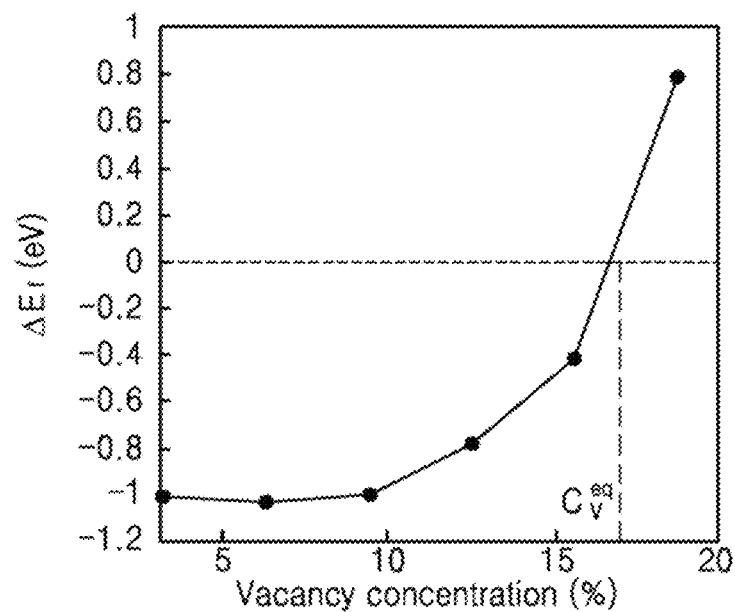
[FIG. 1B]
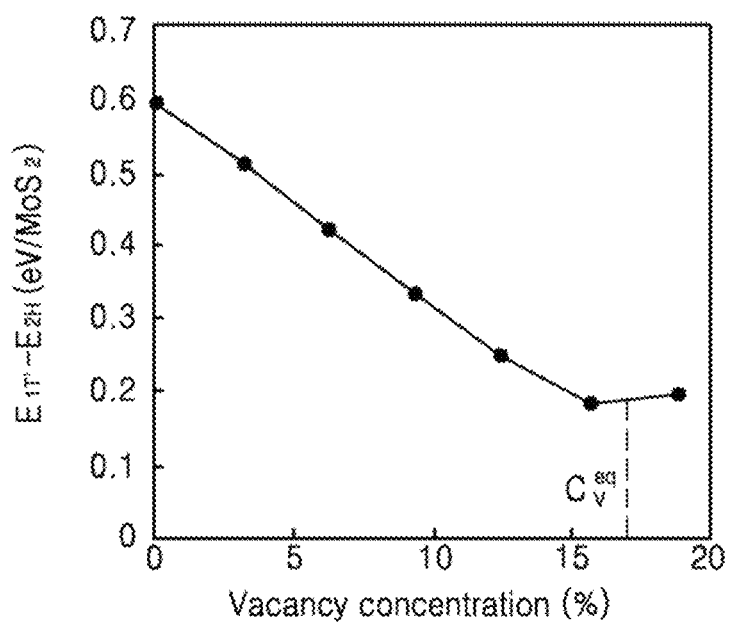

[FIG. 1C]
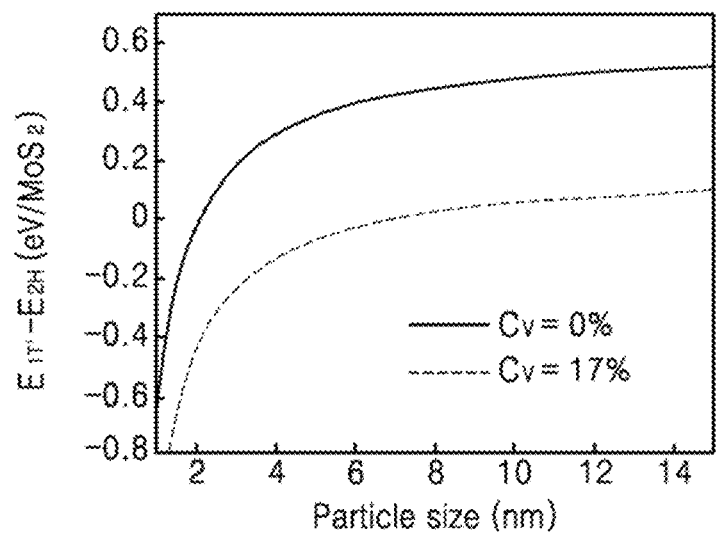
[FIG. 2]
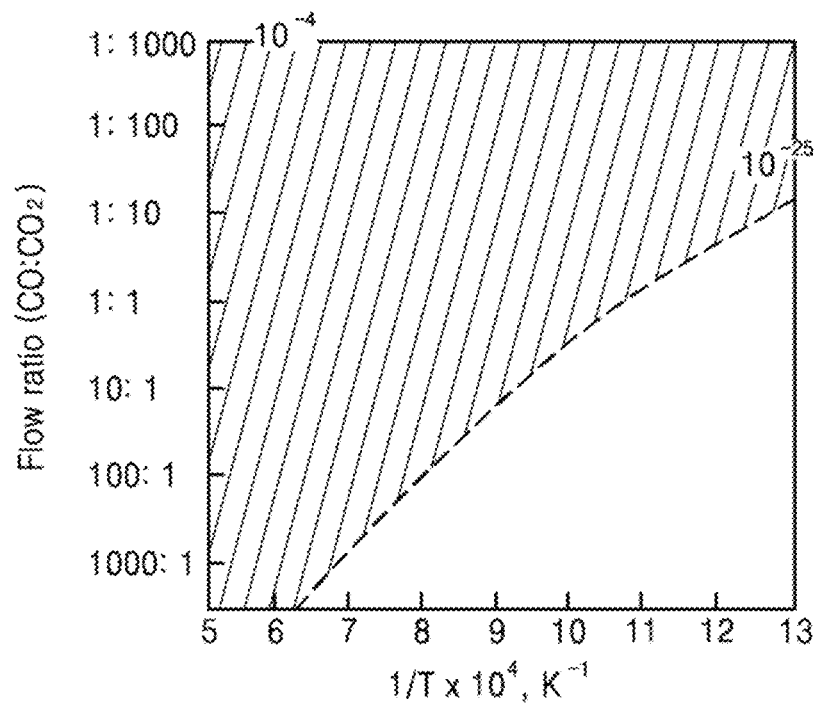

[FIG. 3A]
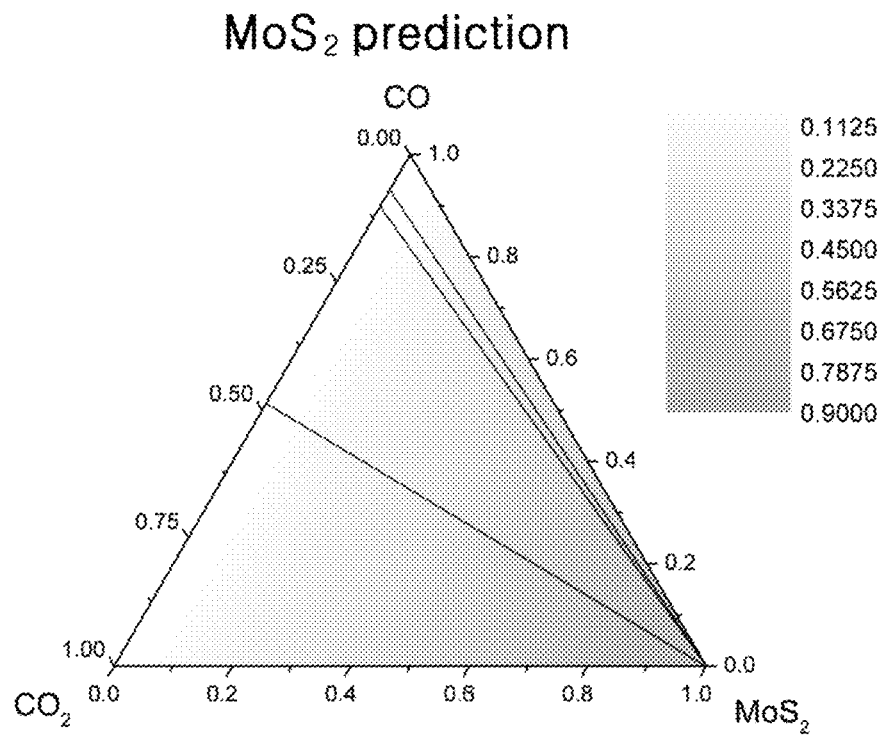
[FIG. 3B]
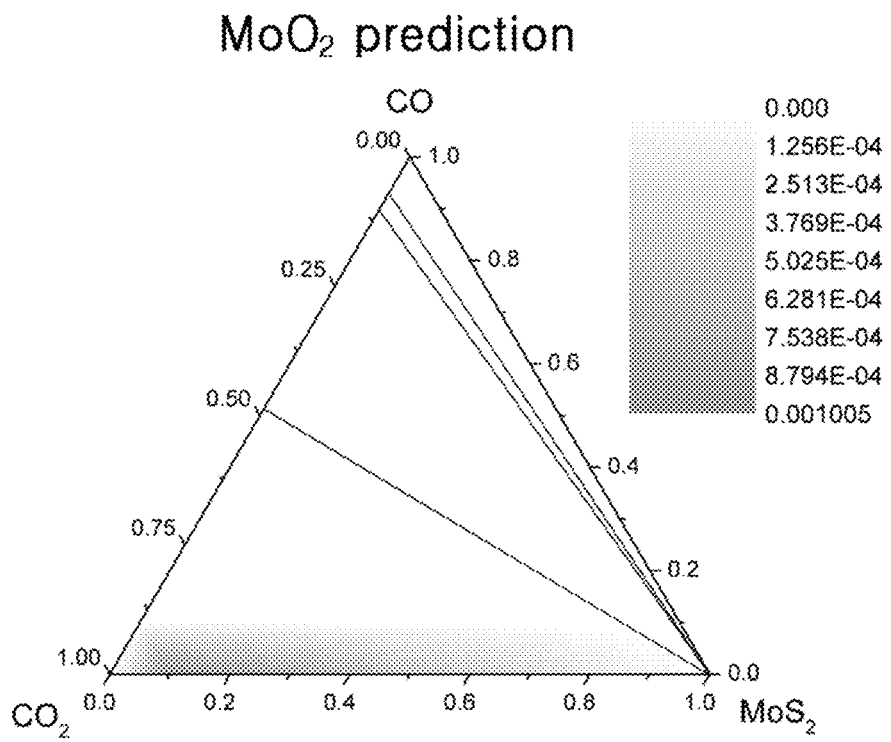

[FIG. 3C]
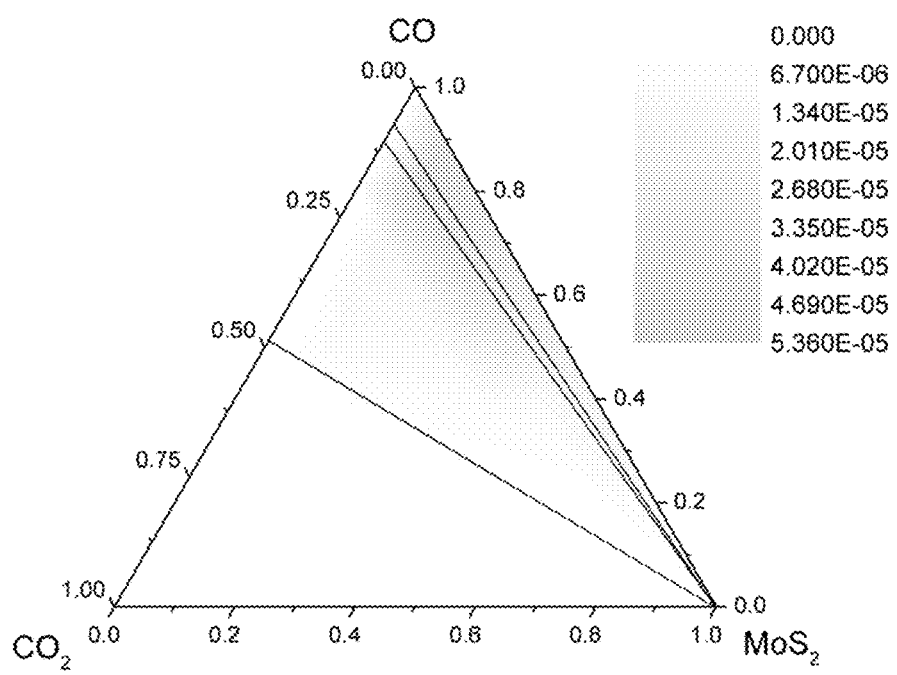

[FIG. 6A]
Before calcination
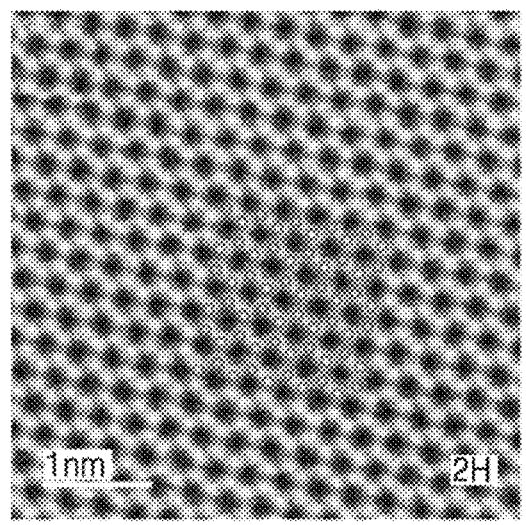
[FIG. 6B]
After calcination
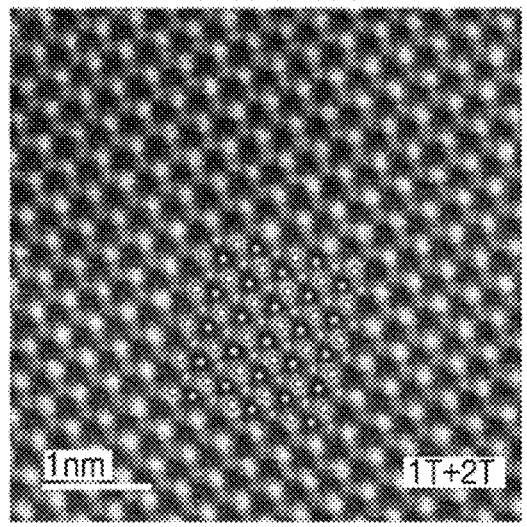

[FIG. 6C]
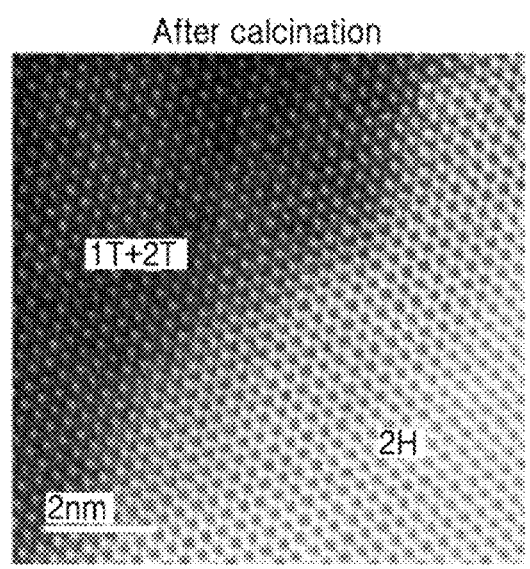

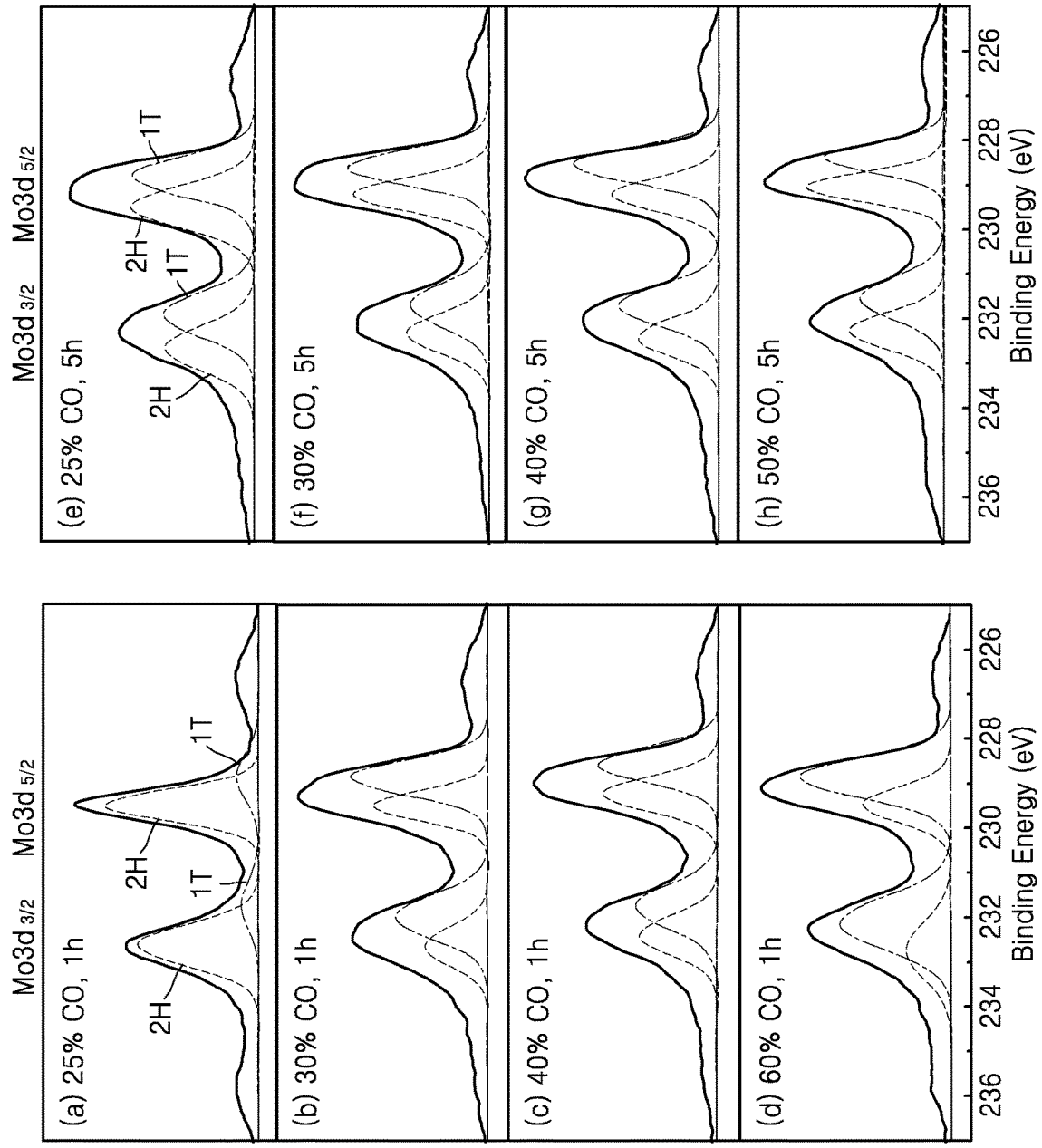
[FIG. 7]

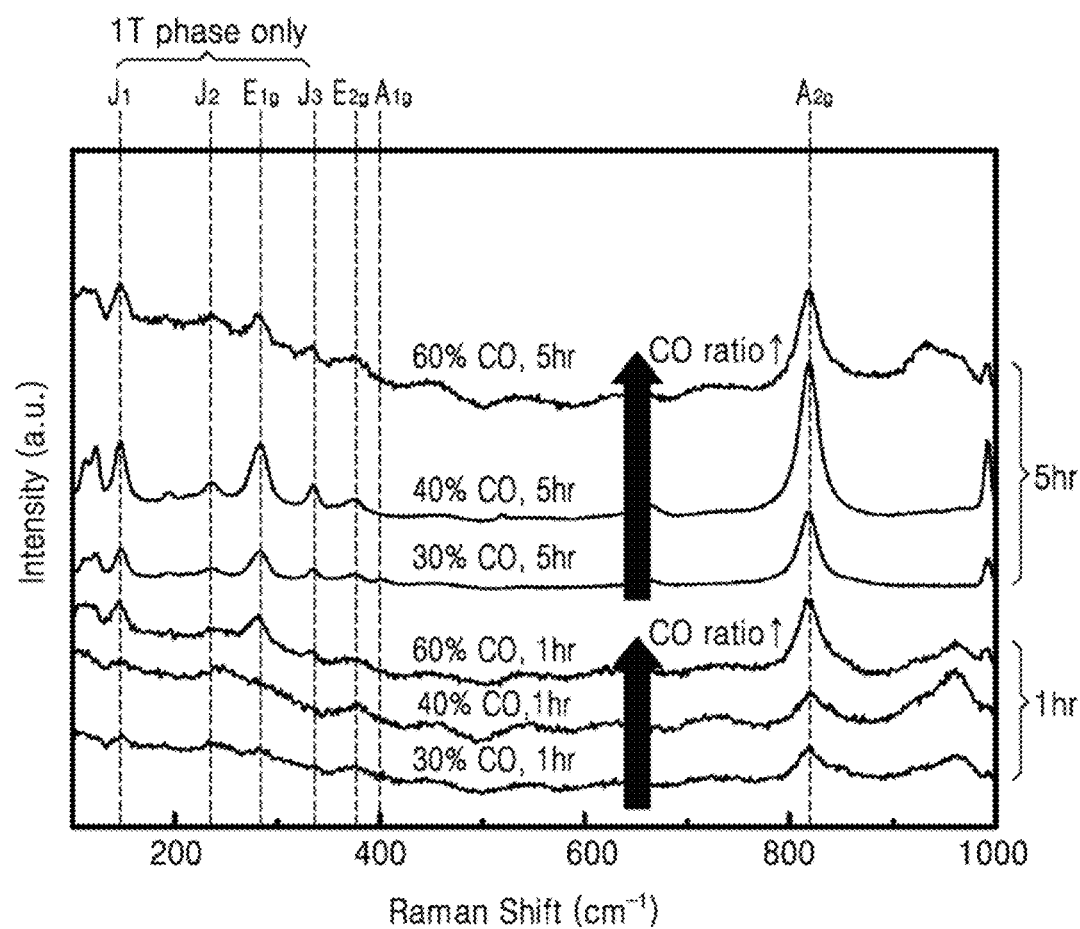
[FIG. 8]

[FIG. 9A]
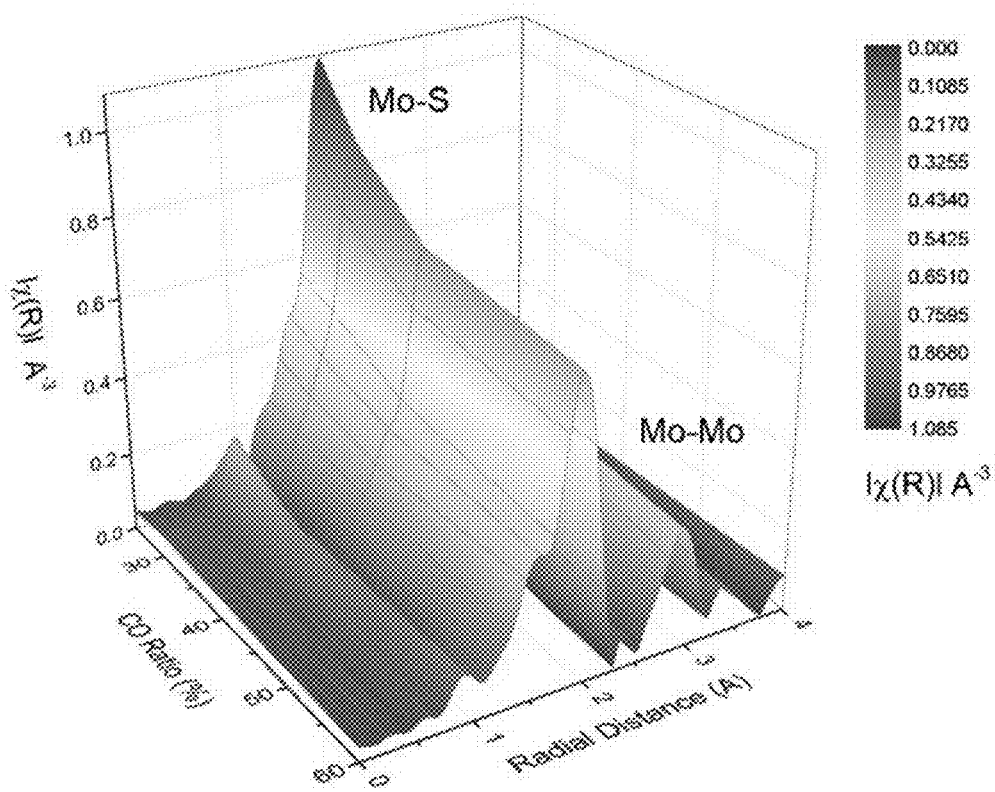
[FIG. 9B]
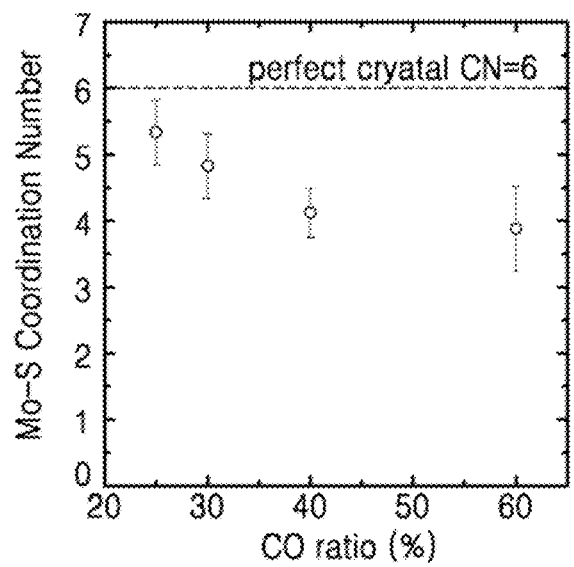

[FIG. 10A]
30% 1h calcination
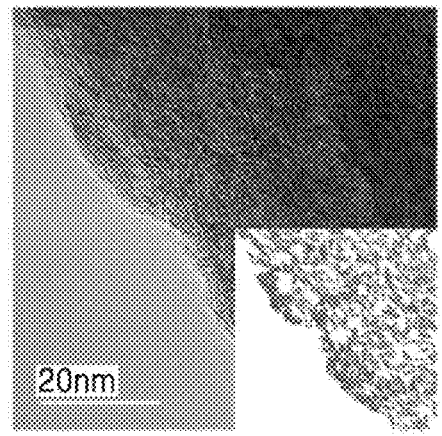
[FIG. 10B]
40% 1h calcination
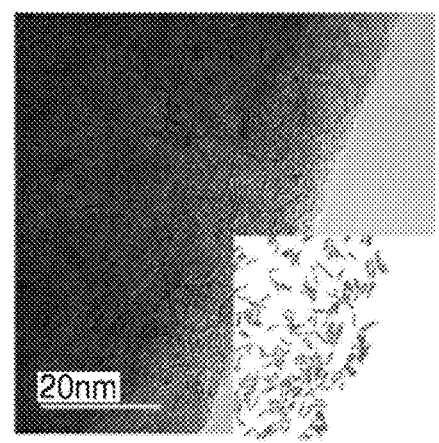
[FIG. 10C]
60% 1h calcination
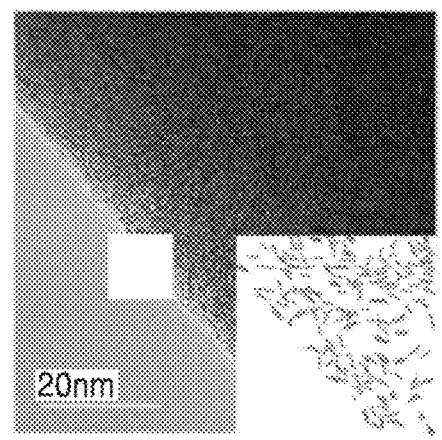

[FIG. 10D]
30% 5h calcination
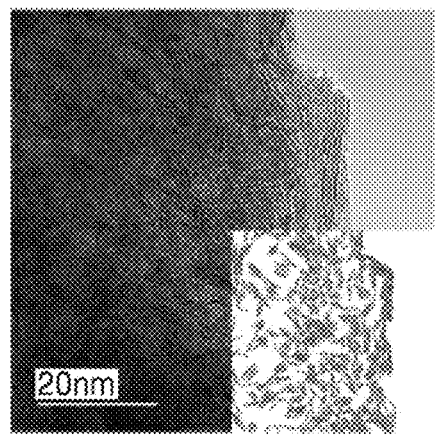
[FIG. 10E]
40% 5h calcination
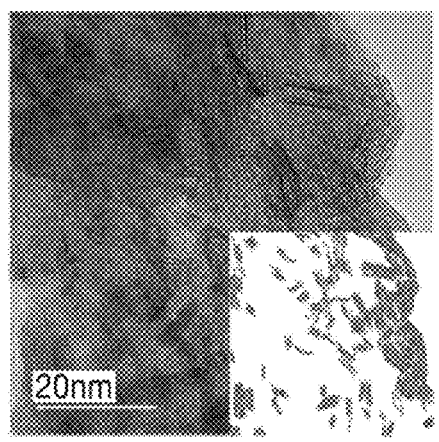
[FIG. 10F]
60% 5h calcination
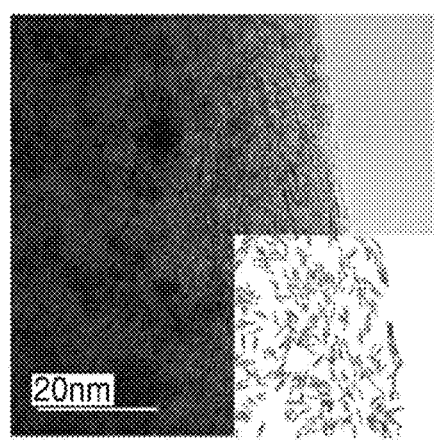

[FIG. 12A]
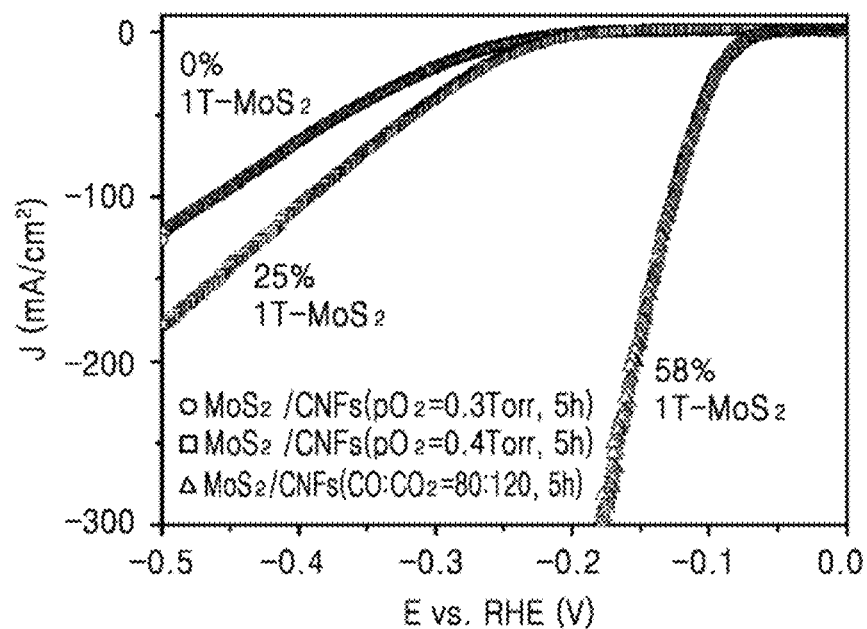
[FIG. 12B]
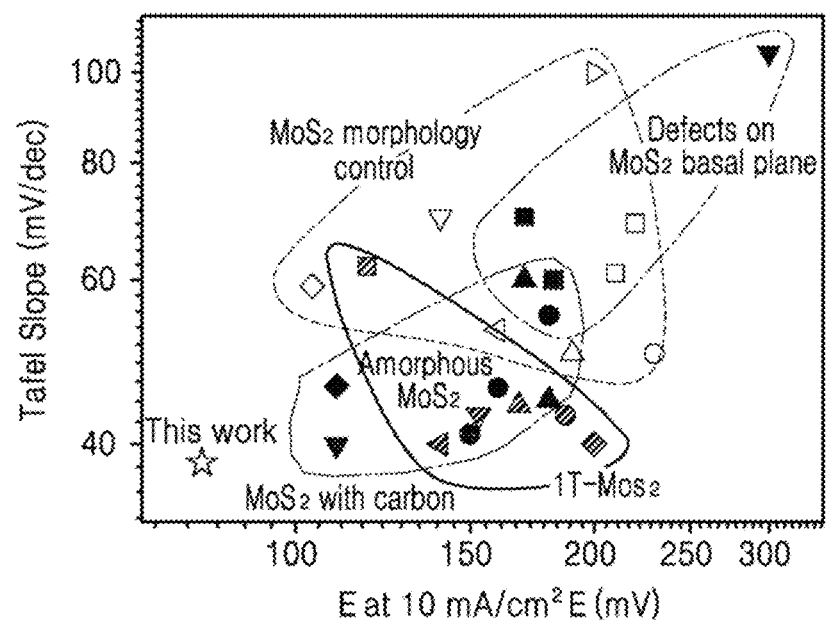

METHOD OF MANUFACTURING $MoS_2$ HAVING 1T CRYSTAL STRUCTURE

CROSS-REFERENCE TO RELATED APPLICATION

This application claims the benefit of Korean Patent Application No. 10-2019-0028798, filed on Mar. 13, 2019, in the Korean Intellectual Property Office, the disclosure of which is incorporated herein in its entirety by reference.

BACKGROUND

1. Field

The present invention relates to a method of manufacturing $MoS_2$ having a 1T crystal structure. More particularly, the present invention relates to a method of performing phase transition of $MoS_2$ having a 2H crystal structure (2H-$MoS_2$) as a stable phase to $MoS_2$ having the 1T crystal structure (1T-$MoS_2$) via reaction with CO gas.

2. Description of the Related Art $MoS_2$ has a two-dimensional (2D) planar structure. With the development of techniques of separating single layers from a bulk material, various physical properties thereof may be induced, e.g., bandgaps may be changed, by adjusting a structural factor such as the number of stacked layers. Therefore, $MoS_2$ has drawn attention in various application fields such as electrochemical, electrical, and optical application fields.

Particularly, depending on the arrangement of sulfur atoms, $MoS_2$ is found in two distinct phases: 1T phase and 2H phase. Since the 1T phase is a metastable phase that is thermodynamically unstable compared to the 2H phase, $MoS_2$ is mostly formed to have a 2H crystal structure in nature. The 2H phase has a hexagonal structure exhibiting electrical properties of semiconductors. In terms of hydrogen-generating catalytic characteristics, the 2H phase has no activity at the bottom surface due to symmetrical alignment of sulfur atoms about a Mo atom, and thus it is important to develop a technique for inducing a single-layered structure (vertically aligned structure) of $MoS_2$ to maximize exposure of edges of the structure for excellent catalytic performance.

On the other hand, the 1T phase has an octahedral structure exhibiting electrical properties of metals. In terms of hydrogen-generating catalytic characteristics, the 1T phase has a very high activity to the bottom surface, and thus extensive research has been conducted to develop a method of inducing the 1T phase.

As methods of inducing the 1T-$MoS_2$ structure developed to data, a method of supplying electrons by substitutional doping of Re, Tc, Mn, and the like, a method of supplying electrons by intercalating alkali metal such as Li or a ligand, a method of inducing a pressure in a layer, and a method of forming empty spaces at S sites using plasma have been reported. However, impurities are inevitably included therein according to these methods, thereby deteriorate physical properties thereof. Although the impurities are removed by performing an additional process after conversion to the 1T phase, the 1T phase tends to easily return to the 2H phase due to very low stability thereof. Also, these methods require a very long processing time over 48 hours to obtain the 1T-$MoS_2$ structure, are not suitable for mass production, and entail considerable production costs.

SUMMARY

The present invention has been proposed to solve various problems including the above problems, and an object of the present invention is to provide a method for quickly and uniformly converting a structure of $MoS_2$ to a 1T crystal structure regardless of the shape of $MoS_2$.

Another object of the present invention is to provide a method for quickly and uniformly converting a structure of $MoS_2$ hybridized with other materials such as carbon nanofiber to a 1T crystal structure.

However, these problems to be solved are illustrative and the scope of the present invention is not limited thereby.

Additional aspects will be set forth in part in the description which follows and, in part, will be apparent from the description, or may be learned by practice of the presented embodiments.

According to an aspect of the present invention to achieve the object, provided is a method of manufacturing molybdenum disulfide ($MoS_2$) having a 1T crystal structure. The method includes performing phase transition from a 2H crystal structure of $MoS_2$ to the 1T crystal structure by reacting $MoS_2$ having the 2H crystal structure with CO gas.

According to an embodiment, the performing of phase transition may include annealing the $MoS_2$ having the 2H crystal structure in an atmosphere including CO gas.

According to an embodiment, the performing of phase transition may include annealing the $MoS_2$ having the 2H crystal structure in an atmosphere including CO gas and $CO_2$ gas.

According to an embodiment, the $MoS_2$ may be in the form of at least one of bulk, powder, film, wire, and fiber.

According to another aspect of the present invention, provided is a method of manufacturing $MoS_2$ having a 1T crystal structure. The method may include forming a $MoS_2$-carbon composite by reacting an $MoS_2$ precursor-organic material composite with CO gas. In this regard, at least one portion of $MoS_2$ included in the $MoS_2$-carbon composite has the 1T crystal structure.

According to an embodiment, the $MoS_2$ precursor-organic material composite may be in the form of fiber.

According to an embodiment, the $MoS_2$ precursor-organic material composite may be prepared by electrospinning.

According to an embodiment, the $MoS_2$ included in the $MoS_2$-carbon composite may have a single-layered or a multi-layered structure.

According to an embodiment, the forming of the $MoS_2$-carbon composite may include annealing the $MoS_2$ precursor-organic material composite in an atmosphere including CO gas.

According to an embodiment, the forming of the $MoS_2$-carbon composite may include annealing the $MoS_2$ precursor-organic material composite in an atmosphere including CO gas $CO_2$ gas.

According to an embodiment, the forming of the $MoS_2$-carbon composite may include annealing performed at a temperature in the range of 700° C. to 1000° C.

According to another aspect of the present invention, provided is a catalyst for generating hydrogen prepared according to the above-described method.

According to another aspect of the present invention, provided is a $MoS_2$-carbon composite.

The $MoS_2$-carbon composite includes a carbon structure in the form of fibers and $MoS_2$ distributed in the carbon structure.

According to an embodiment, the $MoS_2$ included in the $MoS_2$-carbon composite may have a single-layered or a multi-layered structure.

According to an embodiment, at least one portion of the $MoS_2$ may have a 1T crystal structure.

BRIEF DESCRIPTION OF THE DRAWINGS

These and/or other aspects will become apparent and more readily appreciated from the following description of the embodiments, taken in conjunction with the accompanying drawings in which:

FIGS. 1A, 1B and 1C show graphs illustrating free energy of formation of S-vacancies formed in $MoS_2$ via reaction with CO gas and calculated according to DFT and 1T phase stability according to S-vacancy concentration and particle size of $MoS_2$;

FIG. 2 is a graph illustrating equilibrium oxygen partial pressures according to $CO:CO_2$ flow ratio;

FIGS. 3A, 3B and 3C show graphs illustrating amounts of generated $MoS_2$, $MoO_2$, $Mo_2C$, and $MoC$ in a three-component phase diagram of $CO$—$CO_2$—$MoS_2$ at 800° C. at 1 atm;

FIGS. 6A, 6B and 6C show high-resolution transmission electron microscope images obtained to identify formation of 1T of $MoS_2$ powder;

FIG. 7 shows graphs illustrating XPS measurement results of $MoS_2/C$ nanofibers manufactured according to experimental examples of the present invention;

FIG. 8 is a graph illustrating Raman spectrum measurement results of $MoS_2/C$ nanofibers manufactured according to experimental examples of the present invention;

FIGS. 9A and 9B show graphs illustrating extended X-ray absorption fine structure (EXAFS) measurement results of Mo in the $MoS_2/C$ nanofibers according to experimental examples of the present invention;

FIGS. 10A, 10B, 10C, 10D, 10E and 10F show transmission electron microscope images of microstructures of $MoS_2/C$ nanofibers according to experimental examples of the present invention;

FIGS. 12A and 12B show graphs illustrating hydrogen-generating catalytic characteristics of $MoS_2/C$ nanofibers according to experimental examples of the present invention.

DETAILED DESCRIPTION

Figures 4A, 4B:
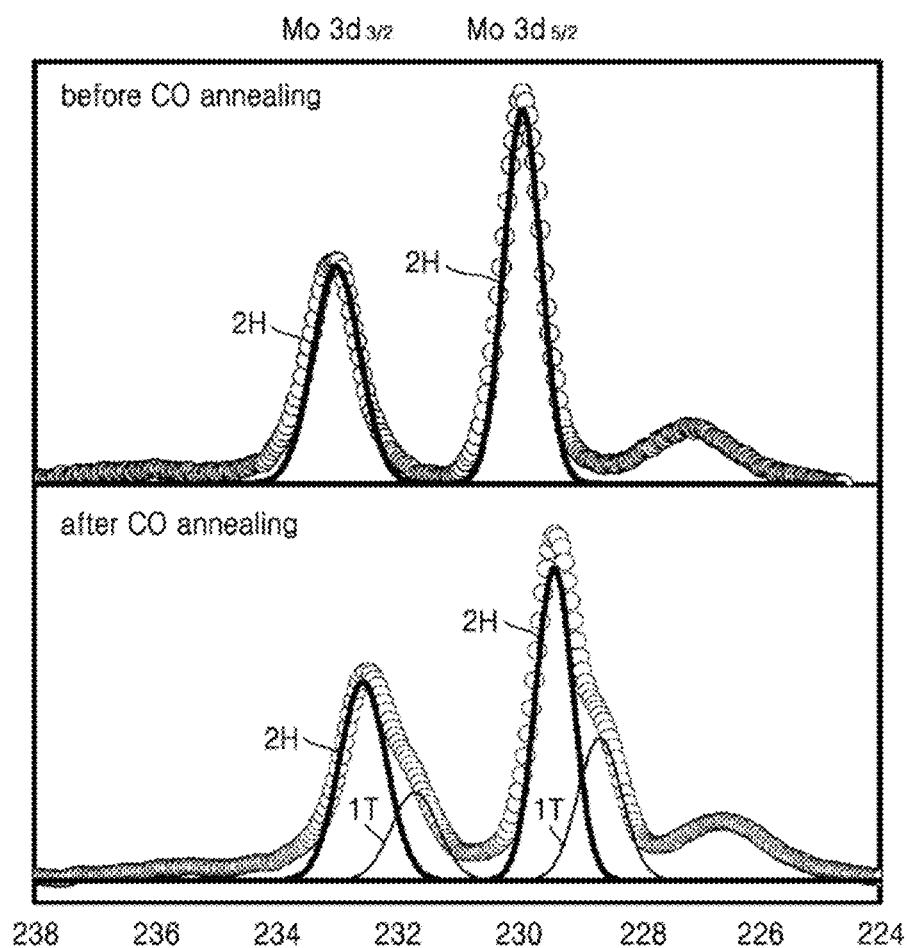
FIGS. 4A, 4B and 5A and 5B are graphs showing X-ray photoelectron spectroscopy (XPS) results to measure formation of a 1T structure in $MoS_2$ powder and a $MoS_2$ precursor according to experimental examples of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views and length, areas, thicknesses, and shapes of elements in the drawings may be exaggerated for descriptive convenience.

Hereinafter, embodiments of the present invention will be described in detail with reference to the accompanying drawings so that these embodiments may be readily implemented by those skilled in the art.

The present invention provides a method of converting a crystal structure of $MoS_2$ by reacting $MoS_2$ or a $MoS_2$ precursor with carbon monoxide (CO) gas. CO is one of the representative reductive gases and the present inventors have found that CO reacts with sulfur (S) contained in $MoS_2$ to induce S-vacancies therein as shown in Reaction Scheme 1 below, resulting in formation of $MoS_2$ having a 1T crystal structure via atomic diffusion and rearrangement by the S-vacancies. The S-vacancy refers to an empty lattice point of a crystal lattice of $MoS_2$ from which an S atom is removed.

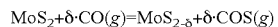

$MoS_2 + \delta \cdot CO(g) = MoS_{2-\delta} + \delta \cdot COS(g)$      Reaction Scheme 1

(where, $MoS_{2-\delta}$ refers to a state in which δ S-vacancies are present in $MoS_2$ and a stoichiometric value of S is reduced by δ from 2.)

FIG. 1A shows free energy of S-vacancy formation ($\Delta E_f$) calculated according to Density Functional Theory (DFT) using S-vacancy concentration as a variable under typical implementation conditions. The typical implementation conditions were set based on results measured in experiments and include a temperature of 800° C., a CO partial pressure of 0.5 atm, a $CO_2$ partial pressure of 0.5 atm, and a COS partial pressure of $10^{-5}$ atm. Meanwhile, (b) of FIG. 1 shows differences between crystal structure energy ($E_{1T'}$) of 1T-$MoS_2$ and crystal structure energy ($E_{2H}$) of 2H-$MoS_2$ according to S-vacancy concentrations. Here, the 1T' structure is a distorted structure of the 1T structure and calculation results show that the 1T' structure is more stable than the 1T structure. In general, the 1T' structure and the 1T structure have similar properties and it is difficult to distinguish one from the other by experiments, and thus the 1T structure may be used as a generic name for both. (C) of FIG. 1 shows $E_{1T'}$-$E_{2H}$ values calculated according to particles sizes of $MoS_2$, in the absence of S-vacancy ($C_V$=0%) and at an equilibrium S-vacancy concentration ($C_V$=17%).

Referring to FIG. 1A, a free energy of S-vacancy formation ($\Delta E_f$) is an almost constant value of about −1 eV, when the S-vacancy concentration is low (below 9%) under the typical implementation conditions. In this regard, an $\Delta E_f$ value less than 0 indicates that S-vacancy formation reaction occurs spontaneously. When the S-vacancy concentration exceeds 9%, the $\Delta E_f$ value begins to increase. The $\Delta E_f$ value is zero, when the S-vacancy concentration reaches about 17% and the $\Delta E_f$ value exceeds 0, when the S-vacancy concentration is greater than 17%. This means that an equilibrium S-vacancy concentration is about 17%, and thus the S-vacancy concentration in the $MoS_2$ may be expected to be about 17% under the typical implementation conditions.

Meanwhile, referring to FIG. 1B, it may be confirmed that a difference between the crystal structure energy of 2H-MoS$_2$ as a stable phase and the crystal structure energy of 1T'-MoS$_2$ decreases as the S-vacancy concentration increases in MoS$_2$. This indicates that thermodynamic stability of the 1T'-MoS$_2$ crystal structure relatively increases as the S-vacancy concentration increases in the crystal lattice of MoS$_2$.

Meanwhile, referring to FIG. 1C, the difference between the crystal structure energy of 2H-MoS$_2$ and the crystal structure energy of 1T'-MoS$_2$ is considerably affected by the particle size of MoS$_2$. As the particle size decreases, the 1T' structure becomes more stable. When the S-vacancy concentration is 0% and the particle size is about 2 nm or less, it may be confirmed that the 1T' structure is more stable than the 2H structure. When the S-vacancy concentration reaches an equilibrium concentration under the conditions according to an embodiment of the present invention, the 1T' structure becomes more stable at a particle size below 7 nm ($C_V$=17%).

Based thereon, it may be inferred that once S-vacancies are formed in MoS$_2$ by CO gas via the reaction represented by Reaction Scheme 1 above, thermodynamic stability of the 1T' crystal structure tends to be improved with an increased S-vacancy concentration caused by the reaction with the CO gas. A decrease in the difference of thermodynamic energy between the 2H and 1T' crystal structures may be understood as an increase in the probability of phase transition from the 2H crystal structure to the 1T' crystal structure. Also, the 1T' crystal structure tends to be more stable as the particle size of MoS$_2$ decreases. In this case, especially in the absence of S-vacancy, the 1T' crystal structure becomes more stable than the 2H crystal structure when the particle size is 2 nm or less. When the S-vacancy concentration reaches the equilibrium concentration of 17% via reaction with CO gas and the particle size is 7 nm or less, the 1T' crystal structure becomes more stable, causing spontaneous phase transition.

Annealing MoS$_2$ in a CO atmosphere may be performed for reaction between CO and MoS$_2$. For example, after MoS$_2$ is placed in an annealing furnace, CO gas may be introduced into the annealing furnace while heating the annealing furnace at a predetermined temperature. The annealing furnace may be used in the atmosphere and may create a vacuum.

In the present invention, the MoS$_2$, a target of reaction with CO gas, may be in various forms such as in the form of bulk, powder, film, wire, and fiber, without being limited to a particular form. Alternatively, pure MoS$_2$ may be present alone or may be mixed or combined with other materials. This may be possible because the reactant that reacts with MoS$_2$ to induce the 1T crystal structure is CO in a gaseous state.

Alternatively, a MoS$_2$ precursor used to chemically synthesize MoS$_2$ may also be a target of reaction with CO. For example, the MoS$_2$ precursor may include ammonium tetrathiomolybdate (ATTM).

As another example, a composite of a MoS$_2$ precursor and an organic material may be a target of reaction with CO. For example, the MoS$_2$ precursor may include ammonium tetrathiomolybdate (ATTM, (NH$_4$)$_2$MoS$_4$), and the organic material may include polyacrylonitrile (PAN) forming a hydrogen bond with the ammonium tetrathiomolybdate. The composite may be in the form of fiber, for example, prepared by electrospinning that is a method of producing fiber by applying electrostatic repulsive force. In electrospinning, a thickness of nanofiber may easily be adjusted according to a magnitude of voltage of several tens of kV applied to a solution and a length of fiber over 100 μm may be realized.

The MoS$_2$ precursor-organic material composite in the form of nanofiber may be converted into MoS$_2$-carbon nanofiber via reaction with CO gas, and at least one portion of MoS$_2$ included in the MoS$_2$-carbon nanofiber may have the 1T crystal structure.

Annealing temperature for reaction between MoS$_2$ and CO may be adjusted according to a partial pressure of CO gas in the annealing furnace, for example, may be in the range of 700° C. to 1000° C.

CO gas alone may be added to the annealing furnace or CO gas diluted in an inert gas such as N$_2$ or Ar may be added to the annealing furnace. Alternatively, a mixed gas of CO and CO$_2$ may be added thereto. When the CO/CO$_2$ gas mixture is added, oxygen may be generated in an small amount corresponding to an equilibrium pressure of the reaction represented by Reaction Scheme 2 during the annealing process. By precisely measuring a partial pressure of the small amount of oxygen using an oxygen sensor and controlling the oxygen partial pressure, the partial pressure of CO gas may be precisely controlled in the annealing furnace.

Also, a microstructure of the composite including MoS$_2$ may be controlled by using the oxygen partial pressure generated in a small amount. For example, the structure of the nanofiber and the particle size and structure of MoS$_2$ contained in the nanofiber may be controlled by adjusting combustion reaction of the MoS$_2$ composition in the form of nanofiber prepared by electrospinning.

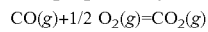
CO(g)+1/2 O$_2$(g)=CO$_2$(g)   Reaction Scheme 2

An equilibrium constant of reaction represented by Reaction Scheme 2 with respect to temperature is well known. Based thereon, equilibrium oxygen partial pressures according to temperatures and CO:CO$_2$ flow ratios are shown in FIG. 2. Here, lines indicate isobars each connecting points of equal oxygen partial pressure at an interval of 10 times of the oxygen partial pressure from 10$^{-25}$ atm to 10$^{-4}$ atm.

When a mixed gas of CO and CO$_2$ reacts with MoS$_2$ under the conditions including a temperature of 800° C. and a pressure of 1 atm, amounts of reaction products according to a concentration of each component are shown in FIGS. 3A to 3C as three-component phase diagrams of CO—CO$_2$—MoS$_2$. FIG. 3A shows the amount of MoS$_2$, FIG. 3B shows the amount of MoO$_2$, and FIG. 3C shows a sum of the amounts of Mo$_2$C and MoC. Referring to FIGS. 3A to 3C, although the MoS$_2$ phase is maintained regardless of the CO:CO$_2$ ratio, the reaction represented by Reaction Scheme 2 proceeds in the reverse direction at a CO$_2$ fraction of 87.5% or greater to increase the oxygen partial pressure so that the MoO$_2$ phase starts to form. On the contrary, when the CO fraction is 75% or greater, the reaction represented by Reaction Scheme 3 proceeds in the reverse direction to increase the concentration of C promoting generation of a carbide so that the Mo$_2$C and MoC start to form. Based on such thermodynamic considerations, the CO:CO$_2$ ratio may be appropriately determined to form a state without impurities such as MoO$_2$, Mo$_2$C, and MoC.

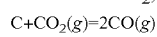
C+CO$_2$(g)=2CO(g)   Reaction Scheme 3

Hereinafter, the present invention will be described in more detail with reference to the following experimental examples. However, these experimental examples are made only for illustrative purposes, and the present invention is not be construed as being limited to those experimental examples.

Experimental Example 1

MoS$_2$ powder having a 2H crystal structure was prepared. The MoS$_2$ powder was placed in an annealing furnace at ambient pressure and heated at a temperature of 800° C. while simultaneously supplying CO gas into the annealing furnace at a flow rate of 80 sccm and $CO_2$ gas thereinto at a flow rate of 120 sccm.

Experimental Example 2

Reaction was performed in the same manner as in Experimental Example 1, except that $(NH_4)_2MoS_4$ (ATTM) that is a precursor of $MoS_2$ was used as a target of reaction with CO gas.

XPS Analysis

Figures 5A, 5B:
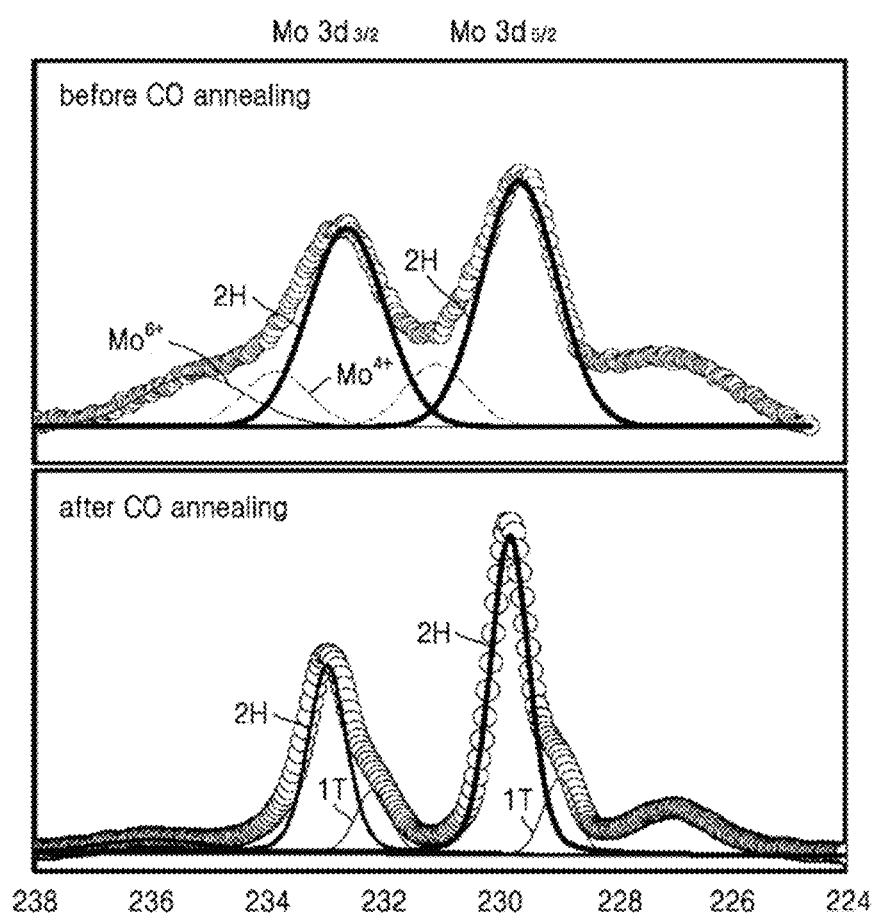

X-ray photoelectron spectroscopy (XPS) was performed on products of Experimental Examples 1 and 2 to observe differences of crystal structures before and after CO gas annealing, and the results are shown in FIGS. 4 and 5. The XPS analysis was performed by using intensities of peaks corresponding to energy levels of Mo $3d_{3/2}$ and Mo $3d_{5/2}$ orbitals of $MoS_2$ having the 2H and 1T crystal structures.

Referring to (a) of FIG. 4 and (a) of FIG. 5, no peak corresponding to the 1T crystal structure was observed before CO gas annealing both in the $MoS_2$ powder and ATTM. On the contrary, referring to (b) of FIG. 4 and (b) of FIG. 5, peaks corresponding to the 1T crystal structure were observed after CO gas annealing. Thus, it was confirmed that $MoS_2$ having the 2H crystal structure was converted into $MoS_2$ having the 1T crystal structure by CO gas annealing.

HRTEM Analysis

To directly observe formation of the 1T crystal structure, a $MoS_2$ single layer was separated from the $MoS_2$ powder of Experimental Example 1 by sonication and a crystal structure thereof was analyzed by using a high-resolution transmission electron microscope (HRTEM). Referring to FIGS. 6A and 6B, the $MoS_2$ powder has the 2H crystal structure before CO gas annealing. However, after CO gas annealing, a mixed phase of the 1T structure and the 2T structure is observed. Here, two layers of the 1T crystal structures constitute a unit of the 2T structure and physical and chemical properties of the 2T crystal structure are known to be similar to those of the 1T crystal structure. Also, in the $MoS_2$ powder after CO gas annealing, both the 2H crystal structure and the 1T+2H crystal structure are observed in a single layer as shown in FIG. 6C. This indicates that the crystal structure of the sample is being converted from the 2H crystal structure into the 1T+2T crystal structure.

Experimental Examples 3 to 10

$MoS_2$-carbon nanofibers (hereinafter, referred to as "$MoS_2$/C nanofibers") were prepared by electrospinning and calcination. First, 1.4 g of ammonium tetrathiomolybdate (ATTM) was dissolved in 5 g of N,N-dimethylformamide (DMF) at 120° C. for 2 hours while stirring, and 0.7855 g of polyacrylonitrile (PAN, Mw=150,000 g/mol) was dissolved in 5 g of DMF at 120° C. for 2 hours while stirring.

Then, the two solutions were mixed and stirred for 10 hours. After the stirring was completed, the mixed solution was added to a syringe of an electrospinning apparatus and a potential of 15 kV was set between a metal tip of the syringe and a collector, and then the mixed solution was sprayed at a rate of 0.3 ml/h using a syringe pump to produce ATTM-PAN nanofibers. The produced ATTM+PAN nanofibers were converted into $MoS_2$/C nanofibers via chemical reactions such as thermal decomposition and oxidation during CO gas annealing.

Specifically, CO gas annealing was performed by using a tube furnace. The annealing was performed while flowing a $CO/CO_2$ gas mixture at 800° C. for 1 hour to 5 hours. In this case, the $CO/CO_2$ gas mixture was prepared using CO and $CO_2$ gases each having a purity of 99.9% by adjusting a ratio of $CO:CO_2$ using a mass flow controller (MFC). Details of Experimental Examples 3 to 10 are shown in Table 1 below.

TABLE 1

| Experimental Example | CO flow rate (sccm) | $CO_2$ flow rate (sccm) | CO flow ratio | Annealing time (h) |
|---|---|---|---|---|
| Experimental Example 3 | 50 | 150 | 25% | 1 |
| Experimental Example 4 | 60 | 140 | 30% | 1 |
| Experimental Example 5 | 80 | 120 | 40% | 1 |
| Experimental Example 6 | 120 | 80 | 60% | 1 |
| Experimental Example 7 | 50 | 150 | 25% | 5 |
| Experimental Example 8 | 60 | 140 | 30% | 5 |
| Experimental Example 9 | 80 | 120 | 40% | 5 |
| Experimental Example 10 | 120 | 80 | 60% | 5 |

Analysis of Crystal Structure

The crystal structures of the manufactured $MoS_2$/C nanofibers were identified by X-ray photoelectron spectroscopy (XPS) and Raman spectroscopy.

(a) to (h) of FIG. 7 are graphs illustrating XPS measurement results of the $MoS_2$/C nanofibers manufactured according to the experimental examples of the present invention. (a) to (d) of FIG. 7 show XPS measurement results of the $MoS_2$/C nanofibers according to Experimental Examples 3 to 6 after annealing for 1 hour according to the CO flow ratio. (e) to (h) of FIG. 7 show measurement results of the $MoS_2$/C nanofibers according to Experimental Examples 7 to 10 after annealing for 5 hours according to the CO flow ratio.

Referring to FIG. 7, it may be confirmed that peaks of 1T-$MoS_2$ are observed by CO gas annealing. Also, as the CO flow ratio and the annealing time increase, a peak intensity of 1T-$MoS_2$ increases and an energy of a peak of 2H-$MoS_2$ is relatively lowered. It may be understood that the higher the CO flow ratio and the longer the annealing time, the better the conversion from 2H-$MoS_2$ to 1T-$MoS_2$. In addition, according to quantitative analysis by deconvolution of XPS results, as the CO flow ratio increases, the ratio of the 1T phase tends to increase and it was confirmed that the 1T phase was formed up to about 70% in Experimental Example 6.

FIG. 8 shows Raman spectrum measurement results of $MoS_2$/C nanofibers manufactured according to Experimental Examples 4 to 6 and Experimental Examples 8 to 10 according to the present invention. Referring to FIG. 8, $J_1$, $J_2$, and $J_3$ peaks that were obtainable only in the 1T phase were identified regardless of the CO flow ratio and the annealing time, and thus it was confirmed that 1T-$MoS_2$ was formed.

In order to verify direct relationship between formation of the 1T-$MoS_2$ crystal structure and the S-vacancy concentration, changes in coordination structures of Mo were identified by measuring an extended X-ray absorption fine structure (EXAFS). FIG. 9A shows Fourier transform results of the EXAFS measurement results of Experimental Examples 7 to 10. Referring to (a) of FIG. 9, it may be confirmed that the peak intensity corresponding to the Mo—S coordination number decreases as the CO flow ratio increases. Referring to FIG. 9B which illustrates quantitative analysis results of the Mo—S coordination number by fitting, the Mo—S coordination number was 5.34±0.49, close to 6 observed in a perfect crystal structure, at a CO flow ratio of 25% (Experimental Example 7), but the Mo—S coordination numbers gradually decreased to 4.83±0.49, 4.12±0.37, and 3.88±0.64 at the CO flow ratios of 30% (Experimental Example 8), 40% (Experimental Example 9), and 60% (Experimental Example 10), respectively, indicating that the number of S-vacancies tends to increase.

FIGS. 10A to 10F show transmission electron microscope images of microstructures of $MoS_2/C$ nanofibers according to experimental examples of the present invention. FIGS. 10A to 10C show results of Experimental Examples 4 to 6 and FIGS. 10D to 10F show results of Experimental Examples 8 to 10.

Referring to FIGS. 10A to 10F, it may be confirmed that the $MoS_2/C$ nanofibers according to the experimental examples of the present invention have a structure in which a single-layer of $MoS_2$ is formed or multi-layers of $MoS_2$ are stacked in the fibrous structure formed of carbon. In this regard, as the CO flow ratio decreases and the annealing increases, the number of stacked layers of $MoS_2$ and the length of $MoS_2$ increase. This is because the combustion amount of carbon increases as the CO flow ratio decreases and the annealing time increases.

First, in terms of the CO flow ratio, as the CO flow ratio decreases, the equilibrium moves to the left in the reaction represented by Reaction Scheme 2 to increase oxygen partial pressure. The increase in the oxygen partial pressure increases the combustion amount of carbon constituting the $MoS_2/C$ nanofiber, thereby enlarging empty space inside the $MoS_2/C$ nanofiber. When $MoS_2$ units migrated through the empty space and gather, the growth of the $MoS_2$ layer in the lengthwise direction is promoted and the number of stacked $MoS_2$ layers increases. In terms of annealing, as the annealing time increases, the combustion amount of carbon increases, thereby increasing the length of the $MoS_2$ layer and the number of stacked $MoS_2$ layers.

Experimental Examples 11 to 12

As a control to verify the effect of the present invention, ATTM-PAN nanofibers prepared in the same manner as in Experimental Examples 3 to 10 were annealed at 800° C. for 5 hours in an oxygen atmosphere instead of the CO atmosphere to prepare samples of Experimental Examples 11 and 12. Here, the oxygen partial pressures were 0.3 Torr and 0.4 Torr in Experimental Examples 11 and 12, respectively. XPS analysis results thereof are shown in FIG. 11.

Figures 11A, 11B:
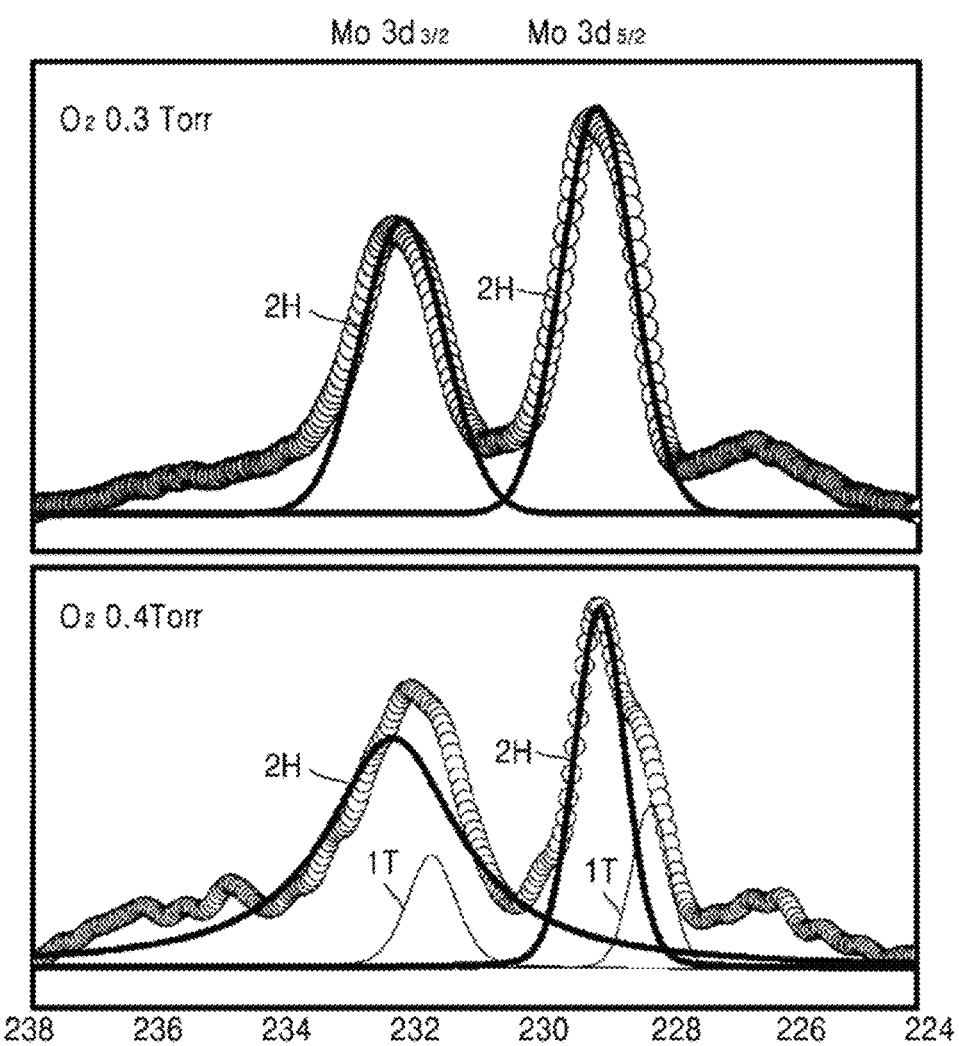
FIGS. 11A and 11B show graphs illustrating XPS measurement results of $MoS_2/C$ nanofibers annealed in an oxygen atmosphere according to experimental examples of the present invention.

Referring to FIG. 11, unlike the results of CO gas annealing, the products had a considerably low 1T structure ratio. According to quantitative analysis results by deconvolution, the ratios of the 1T structures according to Experimental Examples 11 and 12 were about 0% and 25%, respectively.

Measurement of Hydrogen-Generating Catalytic Performance

Performance of the $MoS_2/C$ nanofibers prepared according to experimental examples as hydrogen-generating catalysts was measured. 8 mg of each of the $MoS_2/C$ nanofiber samples prepared according to Experimental Examples 9, 11, and 12, 800 µl of deionized water, 200 µl of ethanol, and a fluorine-based Nafion resin solution were mixed and sonicated for 30 minutes to prepare catalyst measurement inks.

5 µl of the prepared ink was drop-cast on a glassy carbon electrode and dried to prepare an electrode and hydrogen-generating catalytic properties thereof were analyzed by using a 3 electrode H-cell. Here, 0.5 M sulfuric acid aqueous solution was used as an electrolyte, platinum was used as a counter electrode, and a saturated calomel electrode was used as a reference electrode. The activity of hydrogen generation was analyzed at room temperature at a rate of 2 mV/s from −0.6 V to 0 V with reference to a reversible hydrogen electrode. Measurement results were compensated by iR-compensation using a resistance of 5Ω of the electrolyte.

FIGS. 12A and 12B show graphs illustrating measurement results of hydrogen-generating catalytic characteristics of the $MoS_2/C$ nanofibers manufactured according to Experimental Examples 9, 11, and 12.

Referring to FIG. 12A, it was confirmed that the $MoS_2/C$ nanofiber manufactured according to Experimental Example 9 annealed in the CO atmosphere had far better hydrogen-generating catalytic performance at an overvoltage than the $MoS_2/C$ nanofibers manufactured according to Experimental Examples 11 and 12 annealed in the oxygen atmosphere as a control and including very low ratio of the 1T crystal structures of 0% and 25% respectively.

FIG. 12B is a graph illustrating comparison results of hydrogen-generating catalytic characteristics of the $MoS_2$-based materials with respect to overvoltage and Tafel slope. As a result, it was confirmed that the $MoS_2$ according to the present invention had the best performance among the conventional $MoS_2$-based hydrogen-generating catalysts reported so far in both conditions.

According to an embodiment as described above, the effect of quickly and uniformly converting the structure of $MoS_2$ into the $1T$-$MoS_2$ structure regardless of the shape of $MoS_2$ may be obtained.

Also, according to the present invention, the effect of quickly and uniformly converting the structure of $MoS_2$ combined with other materials such as carbon nanofiber into the $1T$-$MoS_2$ structure may also be obtained.

However, the scope of the present invention is not limited by the effects described above.

While exemplary embodiments have been shown and described above, it will be apparent to those skilled in the art that modifications and variations could be made without departing from the scope of the present invention as defined by the appended claims.

What is claimed is:

1. A method of manufacturing molybdenum disulfide ($MoS_2$) having a 1T crystal structure, the method comprising:
    performing phase transition from a 2H crystal structure of $MoS_2$ to the 1T crystal structure by reacting $MoS_2$ having the 2H crystal structure with CO gas.

2. The method of claim 1,
    wherein the performing of phase transition comprises annealing the $MoS_2$ having the 2H crystal structure in an atmosphere including CO gas.

3. The method of claim 1,
    wherein the performing of phase transition comprises annealing the $MoS_2$ having the 2H crystal structure in an atmosphere including CO gas and $CO_2$ gas.

4. The method of claim 2,
    wherein the annealing is performed at a temperature in the range of about 700° C. to about 1000° C.

5. The method of claim 3,
    wherein the annealing is performed at a temperature in the range of about 700° C. to about 1000° C.

6. The method of claim 1,
wherein the $MoS_2$ is in the form of at least one of bulk, powder, film, wire, and fiber.

7. A method of manufacturing $MoS_2$ having a 1T crystal structure, the method comprising:
forming a $MoS_2$-carbon composite by reacting an $MoS_2$ precursor-organic material composite with CO gas,
wherein at least one portion of $MoS_2$ included in the $MoS_2$-carbon composite has the 1T crystal structure.

8. The method of claim 7,
wherein the $MoS_2$ precursor-organic material composite is in the form of fiber.

9. The method of claim 7,
wherein the $MoS_2$ precursor-organic material composite is prepared by electrospinning.

10. The method of claim 7,
wherein $MoS_2$ included in the $MoS_2$-carbon composite has a single-layered or a multi-layered structure.

11. The method of claim 7,
wherein the forming of the $MoS_2$-carbon composite comprises annealing the $MoS_2$ precursor-organic material composite in an atmosphere including CO gas.

12. The method of claim 7,
wherein the forming of the $MoS_2$-carbon composite comprises annealing the $MoS_2$ precursor-organic material composite in an atmosphere including CO gas $CO_2$ gas.

13. The method of claim 11,
wherein the annealing is performed at a temperature in the range of about 700° C. to about 1000° C.

14. The method of claim 12,
wherein the annealing is performed at a temperature in the range of about 700° C. to about 1000° C.

* * * * *